United States Patent
Inoue et al.

(10) Patent No.: US 7,835,888 B2
(45) Date of Patent: Nov. 16, 2010

(54) METHOD AND APPARATUS FOR EXTRACTING CHARACTERISTIC OF SEMICONDUCTOR INTEGRATED CIRCUIT

(75) Inventors: Yoshio Inoue, Kasugai (JP); Takashi Yoneda, Kasugai (JP); Masaru Ito, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 11/389,009

(22) Filed: Mar. 27, 2006

(65) Prior Publication Data

US 2007/0106966 A1  May 10, 2007

(30) Foreign Application Priority Data

Nov. 8, 2005 (JP) .............................. 2005-323806

(51) Int. Cl.
*G06F 17/10* (2006.01)
(52) U.S. Cl. .................. 702/194; 365/149; 702/117; 716/4
(58) Field of Classification Search ......... 702/117–120, 702/179–181, 194; 703/2–4, 13–28; 716/2, 716/4, 5, 17, 18, 19; 365/149
See application file for complete search history.

(56) References Cited

U.S. PATENT DOCUMENTS

| 7,051,314 | B2 | 5/2006 | Goto | |
|---|---|---|---|---|
| 7,139,214 | B2* | 11/2006 | Atwood et al. | 365/149 |
| 2002/0072872 | A1* | 6/2002 | Chatterjee et al. | 702/117 |
| 2006/0150129 | A1* | 7/2006 | Chiu et al. | 716/4 |

FOREIGN PATENT DOCUMENTS

| JP | 9-171522 A | 6/1997 |
|---|---|---|
| JP | 2000-517473 | 12/2000 |
| JP | 2003-196341 A | 7/2003 |
| JP | 2005-019524 | 1/2005 |
| WO | WO 97/21244 | 6/1997 |

OTHER PUBLICATIONS

Tomohiro, Fujita et al., "Statistical Delay Analysis of Large Scale Integrated Circuit", *DA Symposium 2000* Jul. 2000, 91-96, Partial English Translation.

* cited by examiner

*Primary Examiner*—John H Le
(74) *Attorney, Agent, or Firm*—Fujitsu Patent Center

(57) ABSTRACT

A method for efficiently extracting a variation distribution of a characteristic for a semiconductor integrated circuit. The method extracts a characteristic distribution of a semiconductor integrated circuit by performing a mathematical analysis using a polynomial expression based on a variation distribution of a process sensitivity parameter.

9 Claims, 7 Drawing Sheets

Shape 1
Low Density 1
Area 1

Shape 2
High Density 1
Area 1

Shape 1
Low Density 2
Area 2

Shape 2
High Density 2
Area 2

METHOD AND APPARATUS FOR EXTRACTING CHARACTERISTIC OF SEMICONDUCTOR INTEGRATED CIRCUIT

CROSS-REFERENCE TO RELATED APPLICATIONS

This application is based upon and claims the benefit of priority from prior Japanese Patent Application No. 2005-323806 filed on Nov. 8, 2005, the entire contents of which are incorporated herein by reference.

BACKGROUND OF THE INVENTION

The present invention relates to an extraction method and an extraction apparatus for extracting variation distributions of characteristics of a semiconductor integrated circuit.

Large scale integrated circuits (LSIs) have increasingly been miniaturized in recent years. For such miniaturized LSIs, variations in layout patterns and arrangement positions of circuit elements or variations in manufacturing processes greatly affect circuit performance. Systematic variations (variations of which causes can be identified using design data) cannot be distinguished from random variations (variations of which factors cannot be identified using design data) in present LSI design environments. Thus, circuits employ worst-case designs, which take into consideration all possible variations and include excessive margins for overcoming the worst conditions. In recent years, LSIs are required to operate at a lower voltage to reduce power consumption and operate at higher speeds. However, circuits employing worst-case designs with excessive margins hinder reduction in power consumption and increase in operation speed. Moreover, it is difficult to provide sufficient design margins for circuits. It is thus desirable to realize designs with reduced margins. For this purpose, it is important that the distribution of variation characteristics in semiconductor integrated circuits be efficiently extracted.

FIG. 1 shows an example of a process for extracting characteristics of a semiconductor integrated circuit in the prior art. First, an electric circuit is generated based on a netlist 1 and a wire model 2, which are prestored in a library (S1). Then, an electric equivalent circuit is generated (S2).

A cell or macro of the electric equivalent circuit is converted into an approximate polynomial expression, and characteristics at target points are simulated using specific inherent values 4 and derating coefficients 5, which are prestored in a cell/macro library 3 (S3). As a result, characteristics of the semiconductor integrated circuit, such as delay time (operation timing), power consumption, and leak current, at the target points are obtained (S4).

The specific inherent values 4 stored for characteristics, such as delay time, power consumption, and leak current of each cell or macro in the cell/macro library 3, are set under the worst condition (worst point), the best condition (best point), and a typical condition. The typical condition is the most frequently appearing condition.

The derating coefficients 5 are set taking into consideration states in which changes of characteristics depending on positions on each cell or macro chip are the largest and a state in which such changes of the characteristics are the smallest.

The simulation in S3 is performed for each of the above conditions including the worst point and the best point. In S4, the characteristics are obtained for each of the above conditions including the worst point and the best point.

The characteristic extraction process described above enables the characteristics at the worst point and the characteristics at the best point to be obtained. However, to obtain variation distributions, the cell/macro library 3 is required to store specific inherent values 4 in accordance with the necessary points. To obtain variation distributions of such characteristics as a delay time, power consumption, and a leak current for each cell or macro, a large number of specific inherent values 4 need to be set, which results in huge burdens. Further, the simulation in S3 needs to be repeated for a number of times corresponding to the number of necessary points.

As a result, the characteristic distributions cannot actually be obtained in the prior art. Thus, only the characteristics at the worst point and the characteristics at the best point are extracted and used in circuit designs.

SUMMARY OF THE INVENTION

Although the characteristic extraction process of the prior art enables process variations to be considered in detail and analyses to be performed under multiple conditions, the process requires an analysis to be performed at each of multiple points. Thus, simulation needs to be performed for a large number of times to obtain variation distributions of the characteristics. This increases design cost.

Further, the specific inherent values 4 and the derating coefficients 5 stored in the cell/macro library 3 are not set to identify random variations or systematic variations of various process parameters.

When the process parameters are changed (tuned), the specific inherent values 4 and the derating coefficients 5 stored in the cell/macro library 3 need to be adjusted in accordance with the changes of the process parameters.

As a result, designing must be performed by extracting characteristics at the worst point and the best point to ensure sufficient margins based on the extracted characteristics. However, there is a shortcoming in that LSIs employing such designs have margins and cannot reduce power consumption and increase operation speed although recent LSIs are required to operate at high speeds with lower voltages to reduce power consumption.

Japanese Laid-Open Patent Publication No. 2005-19524 describes a performance dispersion calculating apparatus for generating a cell library using a statistical method. The apparatus employs a Monte Carlo simulation analysis process or a response surface analysis process for analyzing cell characteristics.

However, there is a shortcoming in that the Monte Carlo simulation or response surface analysis process requires simulation to be performed a great number of times.

Japanese National Phase Laid-Open Patent Publication No. 2000-517473 describes a manufacturing process monitoring system employing a Monte Carlo simulation analysis process. However, there is a shortcoming in that the process requires simulation to be performed for a great number of times in the same manner as in Japanese Laid-Open Patent Publication No. 2005-19524.

The present invention provides a method and apparatus for efficiently extracting variation distributions of characteristics in a semiconductor integrated circuit.

One aspect of the present invention is a method for extracting a characteristic of a semiconductor integrated circuit. The method includes the steps of generating a variation distribution for a process sensitivity parameter, and extracting a characteristic distribution for the semiconductor integrated circuit by performing mathematical analysis using a polynomial expression based on the variation distribution of the process sensitivity parameter.

Another aspect of the present invention is a method for extracting a characteristic of a semiconductor integrated circuit. The method includes the steps of generating variation distributions for each of process sensitivity parameters, and generating an approximate polynomial expression for an electric equivalent circuit of the semiconductor integrated circuit. The approximate polynomial expression for the electric equivalent circuit of the semiconductor integrated circuit includes parameters representing cell characteristics. The method further includes generating a variation distribution for each of the parameters representing the cell characteristics based on the variation distributions of the process sensitivity parameters and a first polynomial expression, generating a random number for each of the parameters in the approximate polynomial expression based on the approximate polynomial expression and the variation distributions of the parameters representing the cell characteristics, and inserting the random numbers in a second polynomial expression and extracting a characteristic distribution of the semiconductor integrated circuit.

A further aspect of the present invention is an apparatus for extracting a characteristic of a semiconductor integrated circuit. The apparatus includes a cell characteristic extraction unit for calculating a variation distribution for each of a plurality of parameters representing a cell characteristic in accordance with a mathematical analysis using a first polynomial expression based on a variation distribution of a process sensitivity parameter. An equivalent circuit generation unit obtains a random number for each parameter in an approximate polynomial expression of an electric equivalent circuit of the semiconductor integrated circuit based on the variation distribution of each parameter representing the cell characteristics and the approximate polynomial expression. A mathematical analysis unit inserts the random number in a second polynomial expression and extracting a characteristic distribution of the semiconductor integrated circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
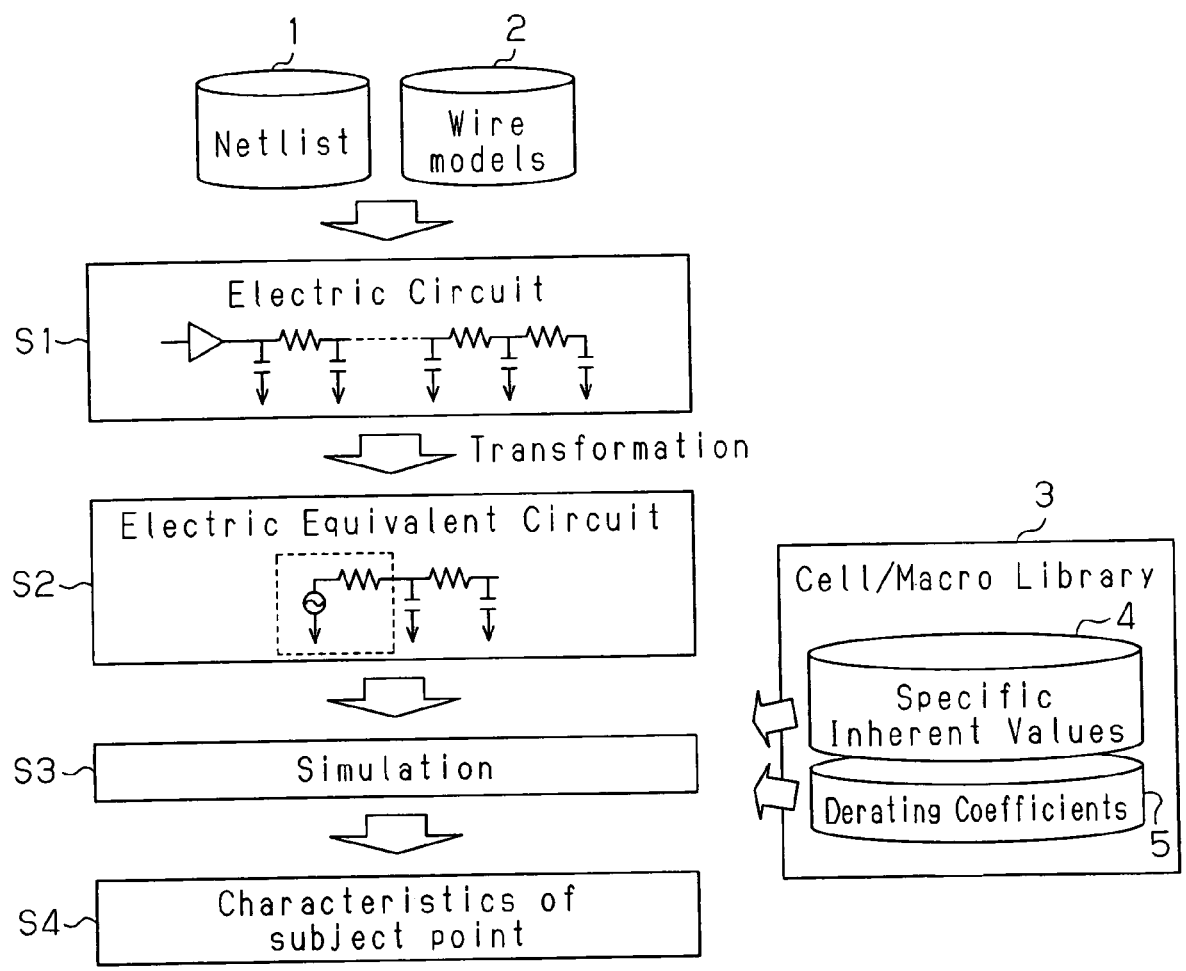
FIG. 1 is a block diagram showing an extraction method and an extraction apparatus for extracting variation distributions of characteristics in a semiconductor integrated circuit of the prior art.
Figure 2:
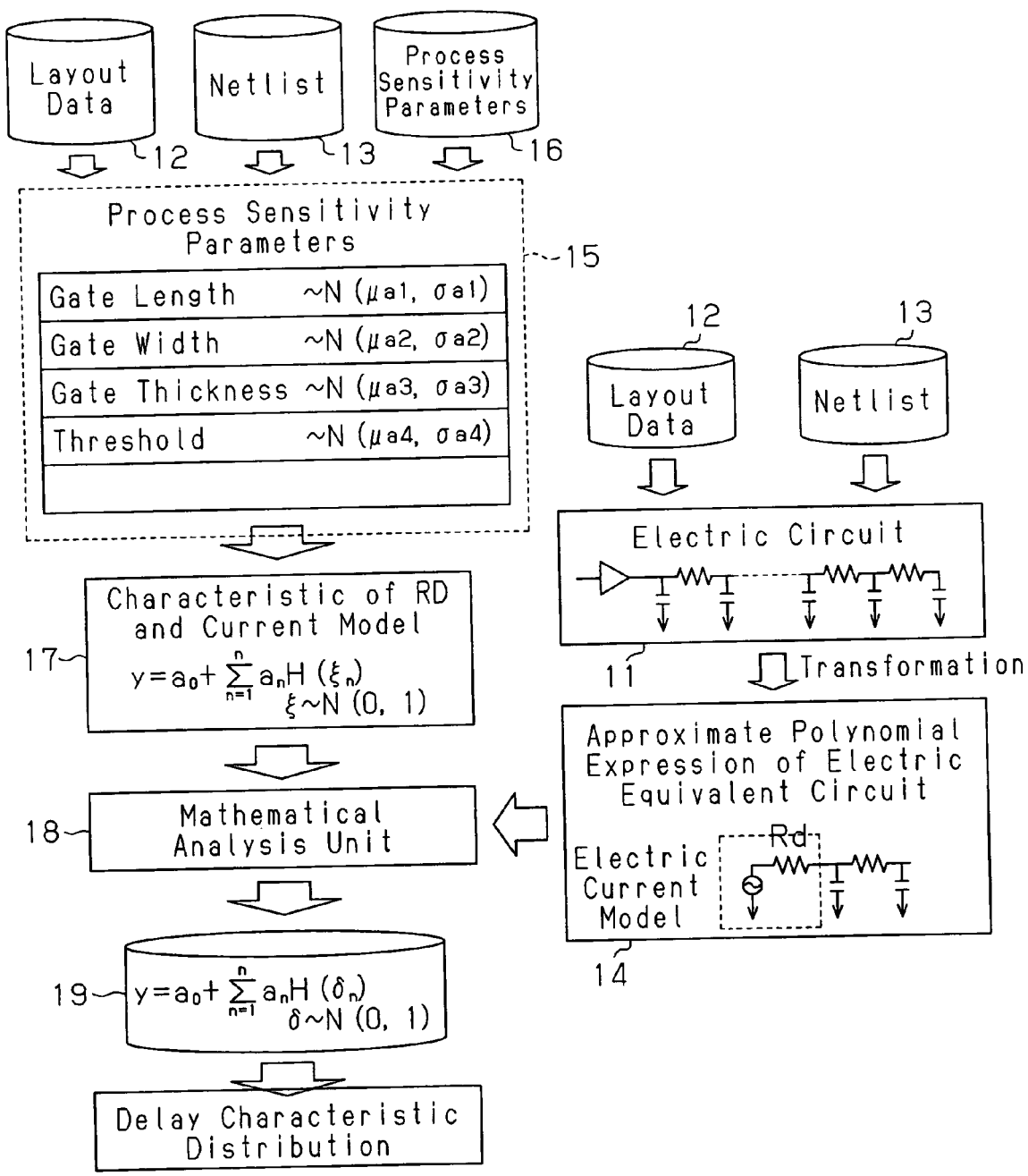
FIG. 2 is a block diagram showing an extraction method and an extraction apparatus for extracting variation distributions of characteristics in a semiconductor integrated circuit according to a first embodiment of the present invention.

FIG. 2 shows a characteristic extraction apparatus according to a first embodiment of the present invention. An electric circuit extraction unit 11 extracts an electric circuit based on layout data and a netlist of a semiconductor integrated circuit, which are prestored in design data storage 12 and 13. The electric circuit extraction unit 11 provides an equivalent circuit generation unit 14 with the extracted electric circuit.

The equivalent circuit generation unit 14 transforms the electric circuit into an electric equivalent circuit, and generates an approximate polynomial expression for the electric equivalent circuit.

A cell characteristic extraction unit 15 extracts performance data of cells based on the layout data and the netlist stored in the design data storage 12 and 13. Based on the performance data and process sensitivity parameters corresponding to the performance data prestored in a library 16, the cell characteristic extraction unit 15 extracts random variations of parameters representing cell characteristics that are included in the approximate polynomial expression, which is generated by the equivalent circuit generation unit 14. The design data storage 12 and 13 and the library 16 may be formed in a single storage or in a plurality of storages.

The process sensitivity parameters may include variation distributions of characteristics such as gate length, gate width, gate thickness, and threshold of a transistor, which are respectively expressed as ~N(μa1, σa1), ~N(μa2, σa2), ~N(μa3, σa3), and ~N(μa4, σa4).

Each of the variation distributions of the parameters representing the cell characteristics of the approximate polynomial expression generated by the cell characteristic extraction unit 15 is calculated using the mathematical expression shown below.

$$y = a_0 + \sum_{n=1}^{n} a_n H(\xi_n) \ldots \quad \xi \sim N(0, 1) \qquad (1)$$

In the expression, $\xi n$ represents random numbers of the process sensitivity parameters, and is expressed using ~N(0, 1). Expression 1 is used to calculate characteristic distributions of the parameters representing such cell characteristics as a resistance (Rd) and an electric current value of a cell, that is, characteristic distributions of the parameters representing the cell characteristics of the approximate polynomial expression generated by the equivalent circuit generation unit 14. Polynomial expressions corresponding to the parameters are stored in the library 17.

A mathematical analysis unit 18 obtains expression 2, which is shown below, in accordance with a typical mathematical analysis process using the polynomial expressions corresponding to the parameters representing the cell characteristics that are extracted by the cell characteristic extraction unit 15 and the approximate polynomial expression that is generated by the equivalent circuit generation unit 14.

$$y = a_0 + \sum_{n=1}^{n} a_n H(\delta_n) \quad \ldots \quad \delta \sim N(0, 1) \quad (2)$$

The obtained polynomial expression is then stored in a library 19. The random numbers δn~N(0, 1) for each parameter included in the approximate polynomial expression are substituted in this polynomial expression so that characteristic distributions of the semiconductor integrated circuit are obtained.

The method of the first embodiment has the advantages described below.

(1) Characteristic distributions of the semiconductor integrated circuit are easily obtained based on the process sensitivity parameters using a typical mathematical analysis process.

(2) The design cost for the semiconductor integrated circuit is reduced.

Figure 3:
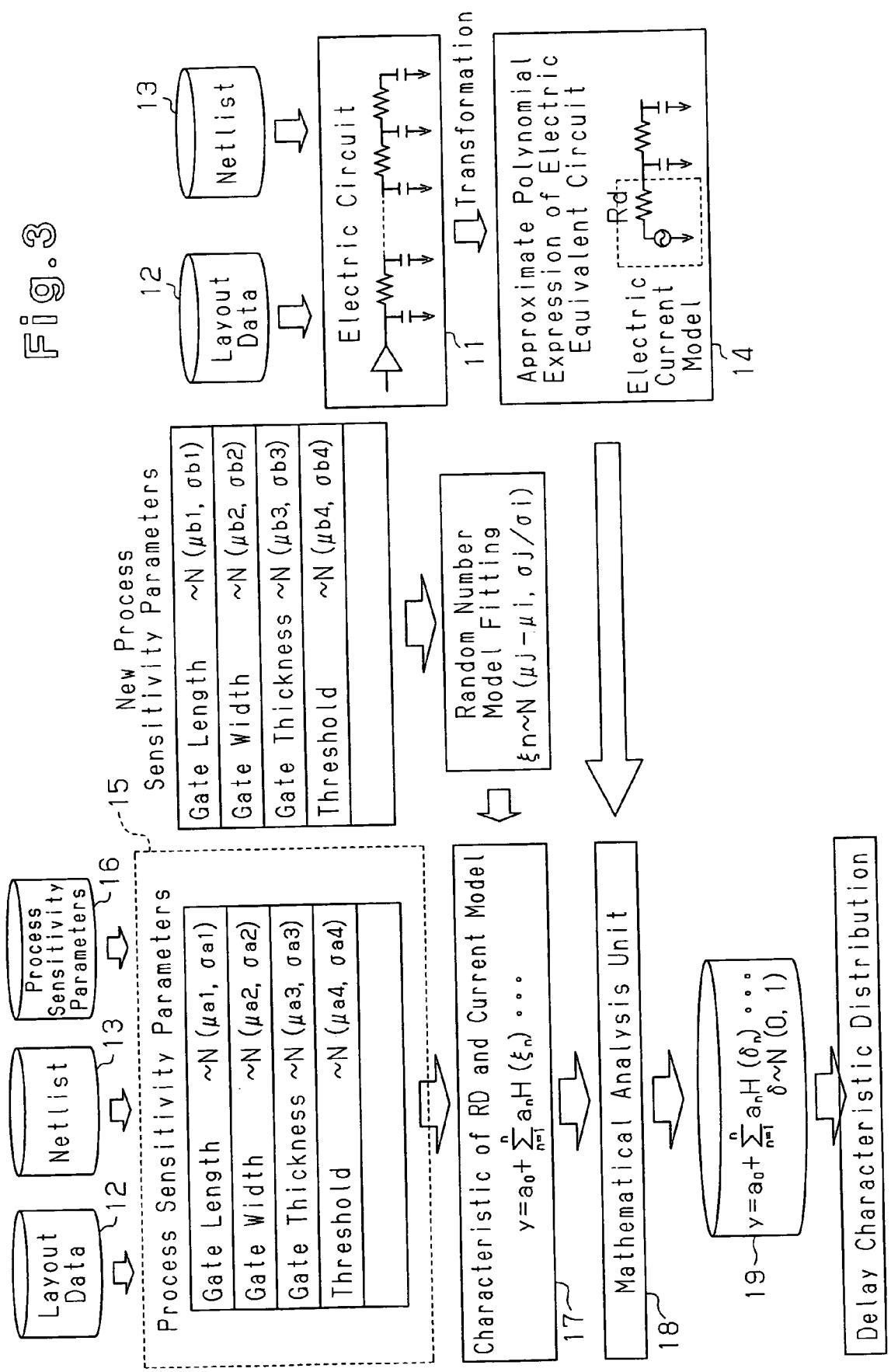
FIG. 3 is a block diagram showing an extraction method and an extraction apparatus for extracting variation distributions of characteristics of a semiconductor integrated circuit according to a second embodiment of the present invention.

A second embodiment of the present invention will now be described with reference to FIG. 3. Like or same reference numerals are given to those components that are the same as the corresponding components of the first embodiment. The second embodiment uses process characteristics differing from those used in the first embodiment. That is, the second embodiment uses new process sensitivity parameters differing from the process sensitivity parameters used in the first embodiment to obtain characteristic distributions of a semiconductor integrated circuit based on the new process sensitivity parameters.

More specifically, new process sensitivity parameters of characteristics such as gate length, gate width, gate thickness, and threshold of a transistor are prepared. The sensitivity parameters of these characteristic are respectively expressed as ~N(μb1, σb1), ~N(μb2, σb2), ~N(μb3, σb3), and ~N(μb4, σb4).

Next, random number models ξn for the process sensitivity parameters are fitted. For example, when basic variation distributions (Xi) of the process sensitivity parameters used in the first embodiment are expressed as Xi~N(μi, σi) and basic variation distributions (Yi) of the new process sensitivity parameters are expressed as Yi~N(μj, σj), the random number models ξn of the new process sensitivity parameters are expressed as ξn~N(μj-μi, σj/σi).

The random number models ξn are substituted in expression 1 so that variation distributions of the parameters representing cell characteristics that reflect variations of different process sensitivity parameters are obtained.

Then, a mathematical analysis unit 18 performs the same processing as in the first embodiment so that characteristic distributions of the semiconductor integrated circuit are obtained.

The second embodiment has the advantage described below in addition to the advantages described in the first embodiment.

Even when the process sensitivity parameters are changed, variations of the parameters representing cell characteristics are easily obtained using polynomial expressions. As a result, the process parameters are easily tuned.

Figure 4:
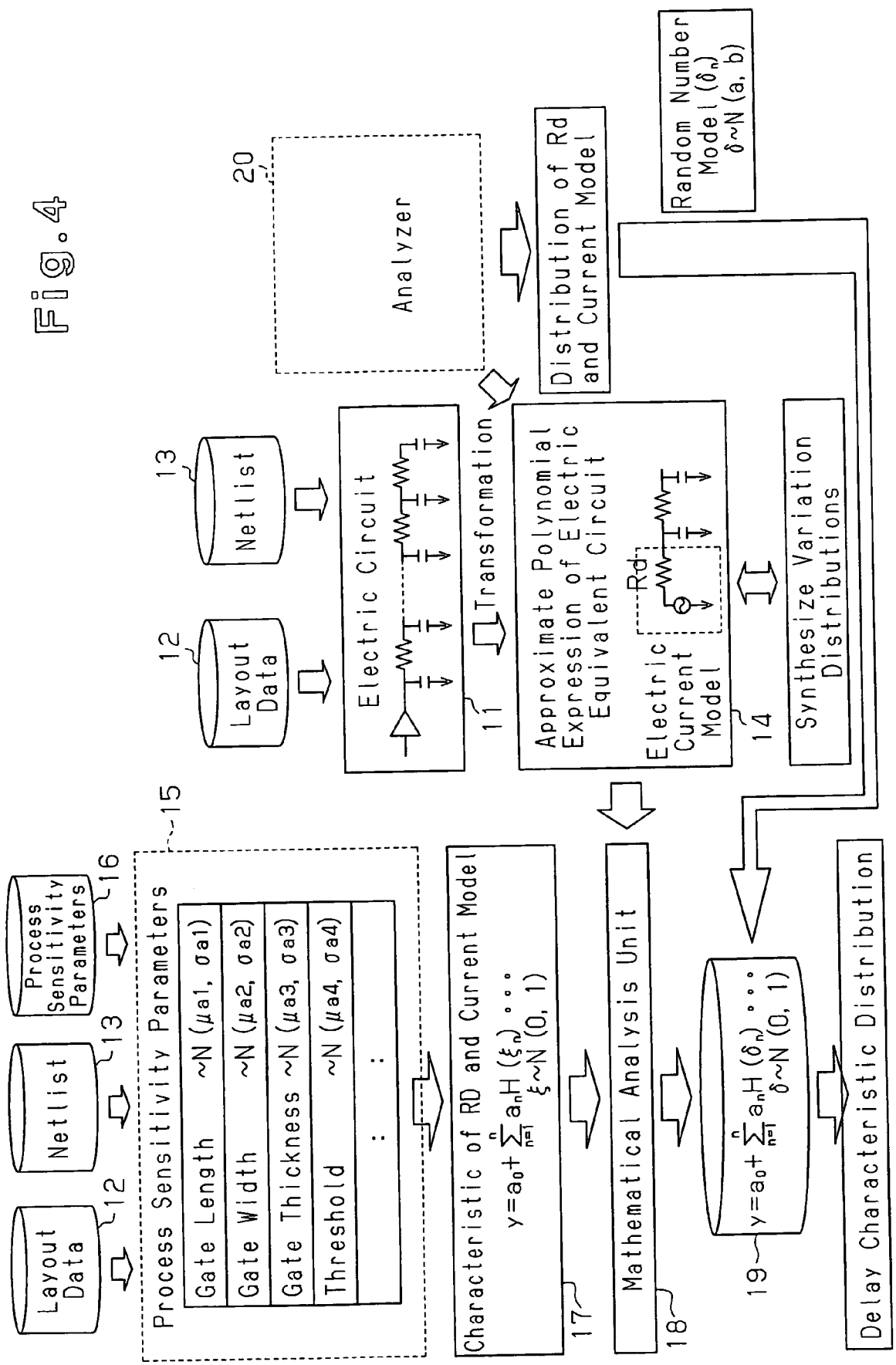
FIG. 4 is a block diagram showing an extraction method and an extraction apparatus for extracting variation distributions of characteristics of a semiconductor integrated circuit according to a third embodiment of the present invention.

A third embodiment of the present invention will now be described with reference to FIG. 4. Like or same reference numerals are given to those components that are the same as the corresponding components of the first embodiment. In the third embodiment, distributions of characteristics of a semiconductor integrated circuit taking into consideration systematic variations of process parameters that are dependent on layout patterns are obtained.

An analyzer 20 for analyzing systematic variations of process parameters extracts variations of process parameters dependent on layout patterns (including pattern shape, pattern density, and arrangement position) from design data storage 12 and 13.

The analyzer 20 then converts the extracted variations of the process parameters into variation distributions of parameters included in an approximate polynomial expression, which is generated by an equivalent circuit generation unit 14. Subsequently, the analyzer 20 outputs the obtained variation distributions as variation distributions of parameters of an approximate polynomial expression taking into consideration systematic variations.

Next, the analyzer 20 synthesizes variation distributions of parameters of an approximate polynomial expression corresponding to random variations obtained by a cell characteristic extraction unit 15 with variation distributions of parameters of an approximate polynomial expression corresponding to systematic variations obtained by the cell characteristic extraction unit 15 in accordance with the addition theorem of probability. This obtains variation distributions of parameters of an approximate polynomial expression corresponding to each instance (e.g., each cell).

Then, the analyzer 20 extracts (generates) random number models δn for the parameters of the approximate polynomial expression reflecting systematic variations using a method similar to the method used in the second embodiment to adjust the random number models ξn.

The random number models δn are substituted in expression 2, so that characteristic distributions of the semiconductor integrated circuit reflecting both random variations and systematic variations are obtained.

The systematic variations of the process parameters analyzed by the analyzer 20 may be reflected in the random numbers ξn in expression 1. In this case, characteristic distributions of the semiconductor integrated circuit reflecting systematic variations are also obtained.

One example of the analyzer 20 will now be described. The analyzer 20, which is formed by a computer-aided design (CAD) apparatus, analyzes a layout pattern included in design data 21. The analyzer 20 selects relevant sensitivity parameter tables from libraries 22 and 23 for each physical element on the layout pattern, such as a transistor. The analyzer 20 generates physical parameter distributions dependent on layouts or physical parameter distributions dependent on assembly stress based on the selected tables and stores the generated physical parameter distributions in a library 25.

Figure 5:
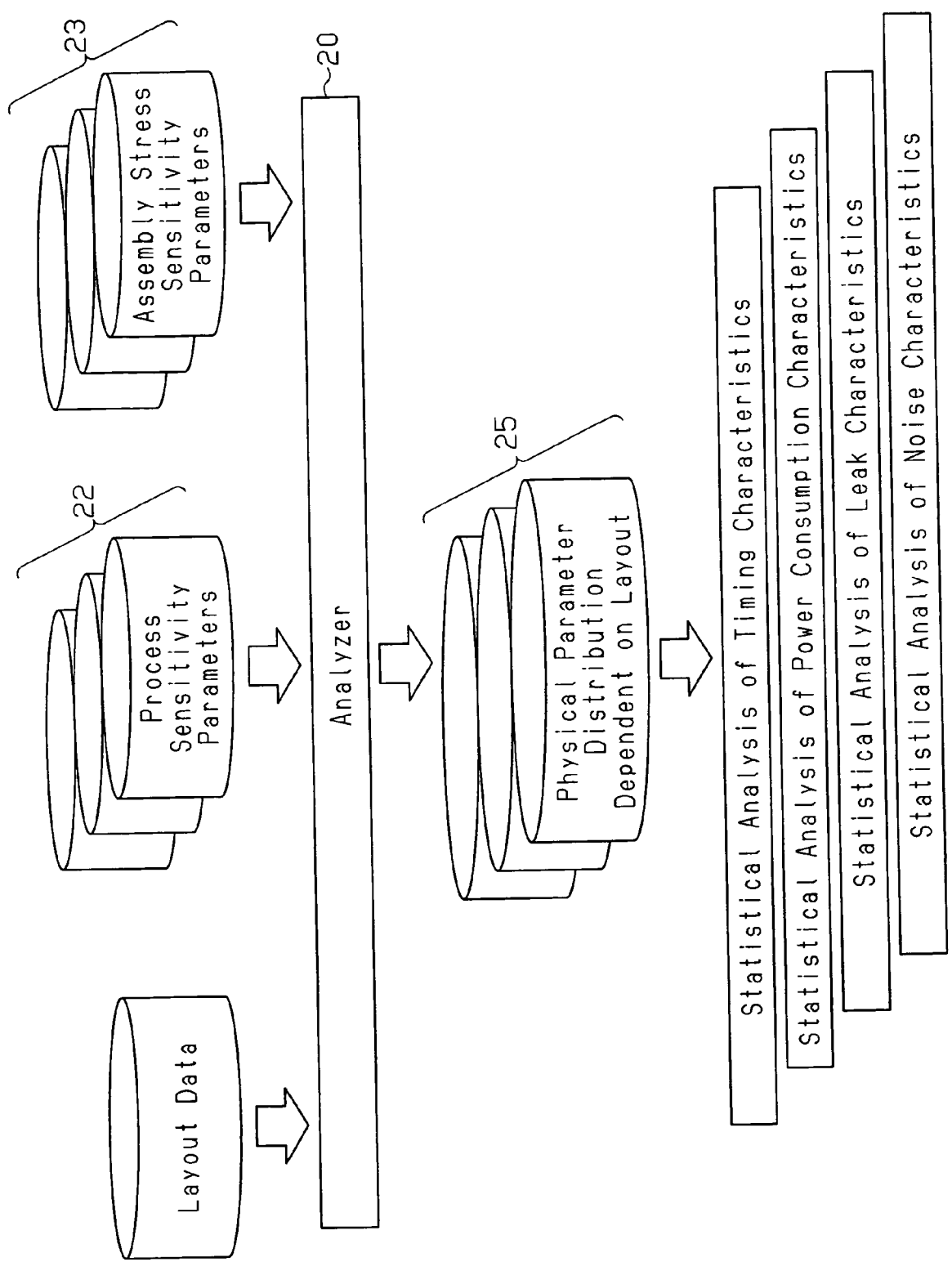
FIG. 5 is a block diagram of a layout analyzer.

The design data 21 shown in FIG. 5 includes generated layout pattern data and layout patterns of chips or blocks.

The libraries 22 and 23 store a plurality of different process sensitivity parameters and a plurality of different assembly sensitivity parameters, respectively.

The process stress sensitivity parameters are stored in the library 22 in the form of tables showing distributions of various parameters that may cause transistor characteristics, such as delay time, noise characteristic, leak current, and power consumption, to be changed due to systematic factors dependent on layouts including pattern shape, pattern density, and arrangement position of a transistor.

As for a transistor, the parameters may include gate length, gate width, gate oxide film thickness, threshold, diffusion resistance, and wire resistance. As for a wire, the parameters may include wire thickness, wire width, interlayer film thickness, dielectric constant, and resistance.

The assembly stress sensitivity parameters are stored in the library 23 in the form of tables showing distributions of various parameters that may cause transistor characteristics, such as delay time, noise characteristic, leak current, and power consumption, to be changed due to systematic factors dependent on stress generated in an assembly process.

The parameters may include gate length, gate width, gate oxide film thickness, threshold, diffusion resistance, and wire resistance, which are dependent on change distributions of package type, chip size, and chip in-plane stress.

Figure 6:
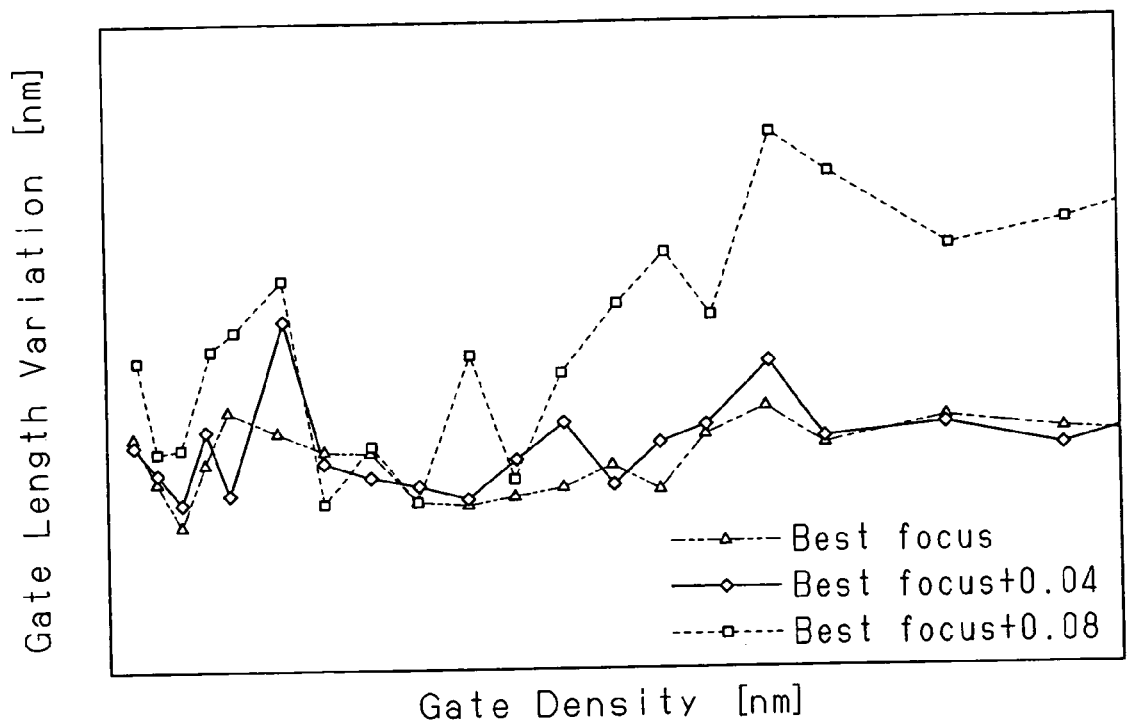
FIG. 6 is a chart showing one example of a table.

FIG. 6 shows one example of tables stored in the library 22. The table shows variations of the gate length that are dependent on the density of gate wires, that is, the interval of gate wires. As shown in FIG. 6, the gate length variations that are dependent on the gate wire interval are measured through experiments and simulations, which are performed under a plurality of light exposure conditions. The measured values are stored in the library 22 as tables.

Other variations are also measured through experiments and simulations, and the measured values are stored as tables in the library 22 or the library 23.

Figure 7:
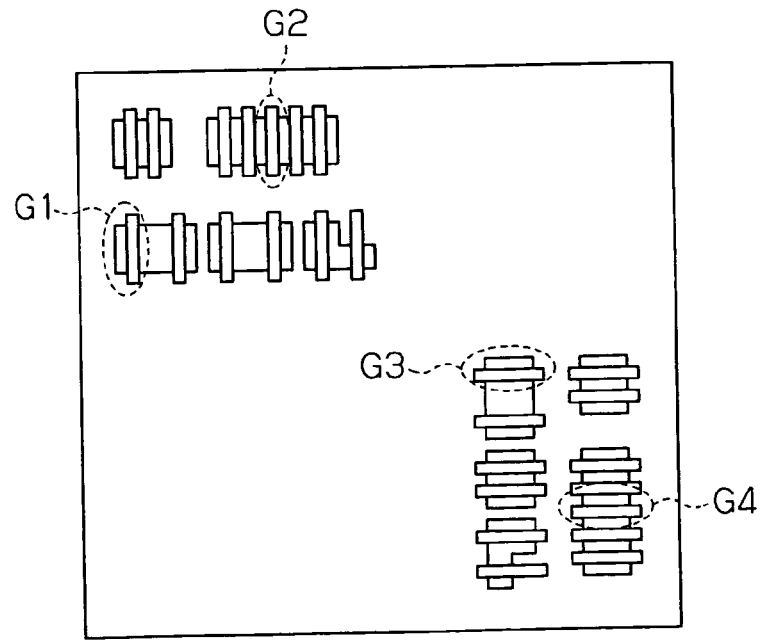
FIG. 7 is a diagram showing one example of a layout on a chip.

FIG. 7 shows one example of layout patterns included in the design data 21. In this layout pattern, a large number of transistors are arranged on a chip. To obtain physical parameter distributions of a gate wire that are dependent on layouts based on this layout pattern, the analyzer 20 first analyzes this layout pattern, and analyzes, for example, the pattern shape, the gate wire density, and the arrangement position of each of the gate wires G1 to G4.

The analyzer 20 then selects sensitivity parameter tables corresponding to, for example, the pattern shape, gate wire density, and arrangement position (area) of each of the gate wires G1 to G4 from the library 22. For example, tables 1 to 4 (FIGS. 8A to 8D) respectively corresponding to the gate wires G1 to G4 are selected.

The variation distribution models (distribution curves) in tables 1 to 4 are stored in the library 25 as physical parameter distributions that are dependent on layouts. The physical parameter distributions stored in the library 25 are usable for statistical analysis of timing characteristics including delay time, statistical analysis of power consumption characteristics, statistical analysis of leak characteristics, and statistical analysis of noise characteristics.

Figure 8A:
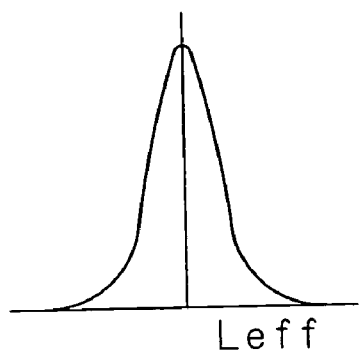
FIGS. 8A to 8D are diagrams respectively showing variation distribution models stored in tables 1 to 4.
Figure 8B:
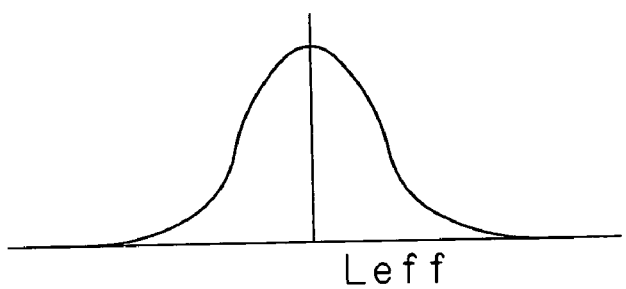
Figure 8C:
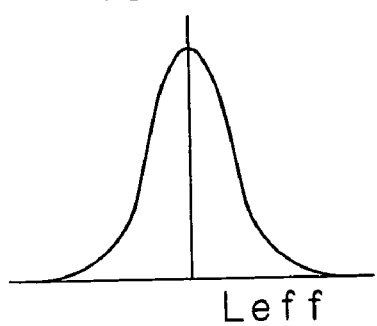
Figure 8D:
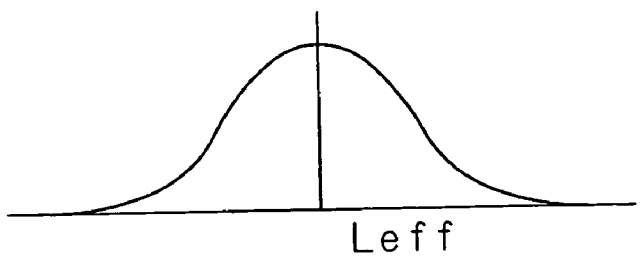

Although FIGS. 7 to 8D only show the physical parameter distributions of transistors, however, physical parameter distributions of a wire resistance and a wire capacitance of wire patterns may also be generated in the same manner as the transistor physical parameter distributions and be stored in the library 25.

In this case, the tables in the library 22 include variation data of wire thickness, wire width, interlayer film thickness, dielectric constant, resistance, and contact resistance, which are dependent on shape, density, arrangement position, etc. of each wire pattern.

The analyzer 20 analyzes the layout pattern data stored in the design data 21, and extracts, for example, a pattern shape, a density, an arrangement position of every segment of a wire. The analyzer 20 then selects tables corresponding to the extracted data from the library 22, and obtains variation distributions of a wire resistance and a wire capacitance from the selected tables.

Next, the analyzer 20 synthesizes variation distributions of a wire resistance and a wire capacitance corresponding to a plurality of segments, generates variation distributions of a wire resistance and a wire capacitance corresponding to one net, that is, physical parameter distributions corresponding to one net, and stores the generated physical parameter distributions in the library 25.

The third embodiment has the advantage described below in addition to the advantages of the first embodiment.

Characteristic distributions are obtained for the semiconductor integrated circuit, while taking into consideration random variations of process sensitivity parameters and systematic variations dependent on layouts.

It should be apparent to those skilled in the art that the present invention may be embodied in many other specific forms without departing from the spirit or scope of the invention. Particularly, it should be understood that the present invention may be embodied in the following forms.

What is claimed is:

1. A method for extracting a characteristic of a semiconductor integrated circuit, the method comprising:
   generating, by an equivalent circuit generating unit, an approximate polynomial expression for an electric equivalent circuit of the semiconductor integrated circuit;
   generating a variation distribution for a cell included in the electric equivalent circuit based on variation distributions for a process sensitivity parameter; and
   extracting a characteristic distribution for the semiconductor integrated circuit by performing mathematical analysis using the approximate polynomial expression based on the variation distribution for the cell.

2. A method for extracting a characteristic of a semiconductor integrated circuit, the method comprising:
   generating, by an equivalent circuit generating unit, an approximate polynomial expression for an electric equivalent circuit of the semiconductor integrated circuit, wherein the approximate polynomial expression includes parameters representing a cell characteristic for a cell included in the electric equivalent circuit;
   generating variation distributions for the parameters based on variation distributions of process sensitivity parameters and a first polynomial expression;
   generating a random number for each of the parameters in the approximate polynomial expression based on the variation distributions of the parameters; and
   inserting the random numbers in a second polynomial expression and extracting a characteristic distribution of the semiconductor integrated circuit.

3. The method according to claim 2, wherein the generating the variation distributions for the parameters includes generating the variation distributions for the parameters based on a large number of first polynomial expressions, each generated for one of the parameters.

4. The method according to claim 3, further comprising:
   generating a characteristic distribution for each of the parameters in the approximate polynomial expression for each cell based on the large number of first polynomial expressions.

5. The method according to claim 2, further comprising:
   substituting in the first polynomial expressions random numbers of different process sensitivity parameters obtained through a different process and generating variation distributions for each of the parameters.

6. The method according to claim 2, further comprising:
   synthesizing random variations and systematic variations of the process sensitivity parameters in accordance with addition theorem of probability, and substituting in the first polynomial expression a random number generated based on a value resulting from the synthesizing.

7. The method according to claim 2, further comprising:

synthesizing random variations and systematic variations of the process sensitivity parameters in accordance with addition theorem of probability, and substituting in the second polynomial expression a random number generated based on a value resulting from the synthesizing.

8. An apparatus for extracting a characteristic of a semiconductor integrated circuit, the apparatus comprising:

a cell characteristic extraction unit calculating a variation distribution for each of a plurality of parameters representing a cell characteristic for a cell included in an equivalent circuit of the semiconductor integrated circuit in accordance with a first polynomial expression based on a variation distribution of a process sensitivity parameter;

an equivalent circuit generating unit obtaining a random number for each parameter in an approximate polynomial expression of the electric equivalent circuit based on the variation distributions of the parameters representing the cell characteristics; and a mathematical analysis unit inserting the random number in a second polynomial expression and extracting a characteristic distribution of the semiconductor integrated circuit.

9. The apparatus according to claim 8, further comprising:

a storage storing layout data, a netlist, and process sensitivity parameters for the semiconductor integrated circuit, wherein the cell characteristic extraction unit extracts performance data of cells based on the layout data and the netlist, and extracts random variations of parameters representing cell characteristics that are included in the approximate polynomial expression, which is generated by the equivalent circuit generating unit, based on the performance data and process sensitivity parameters corresponding to the performance data.

* * * * *